United States Patent
Shiu et al.

(10) Patent No.: US 9,728,567 B2
(45) Date of Patent: Aug. 8, 2017

(54) SEMICONDUCTOR SENSOR DEVICE

(71) Applicant: UNITED MICROELECTRONICS CORP., Hsinchu (TW)

(72) Inventors: Jian-Bin Shiu, Hsinchu County (TW); Wen-Zheng Yu, Pingtung County (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 149 days.

(21) Appl. No.: 14/093,605

(22) Filed: Dec. 2, 2013

(65) Prior Publication Data

US 2015/0155321 A1    Jun. 4, 2015

(51) Int. Cl.
*H01L 27/146* (2006.01)

(52) U.S. Cl.
CPC .. *H01L 27/14625* (2013.01); *H01L 27/14629* (2013.01); *H01L 27/14685* (2013.01)

(58) Field of Classification Search
CPC .......... H01L 27/1462; H01L 27/14621; H01L 27/14623; H01L 27/14625; H01L 31/02327
See application file for complete search history.

(56) References Cited

U.S. PATENT DOCUMENTS

| | | | |
|---|---|---|---|
| 4,353,056 A | 10/1982 | Tsikos | |
| 4,394,773 A | 7/1983 | Ruell | |
| 5,148,302 A * | 9/1992 | Nagano et al. | 349/201 |
| 6,011,859 A | 1/2000 | Kalnitsky et al. | |
| 6,191,593 B1 | 2/2001 | Tartagni et al. | |
| 6,234,031 B1 * | 5/2001 | Suga | G06K 9/0002 73/862.474 |
| 6,282,303 B1 | 8/2001 | Brownlee | |
| 6,320,394 B1 | 11/2001 | Tartagni | |
| 7,031,500 B1 * | 4/2006 | Shinohara | G06K 9/0002 382/124 |
| 2002/0014651 A1 * | 2/2002 | Thomas | G06K 9/00053 257/312 |
| 2002/0176151 A1 * | 11/2002 | Moon et al. | 359/298 |
| 2004/0252867 A1 * | 12/2004 | Lan | G06K 9/0004 382/124 |
| 2005/0046716 A1 * | 3/2005 | Haas et al. | 348/302 |
| 2007/0298533 A1 * | 12/2007 | Yang et al. | 438/57 |
| 2010/0224880 A1 * | 9/2010 | Kimura | 257/59 |
| 2010/0322555 A1 * | 12/2010 | Vermeulen et al. | 385/28 |
| 2011/0051889 A1 * | 3/2011 | Sato | 378/36 |
| 2011/0175702 A1 * | 7/2011 | Desnoyers | G06K 9/0002 340/5.82 |
| 2013/0032727 A1 * | 2/2013 | Kondoh | 250/394 |
| 2015/0131100 A1 * | 5/2015 | Reck | G01L 11/02 356/445 |

OTHER PUBLICATIONS

Tartagni, et al., "FP 12.3: A 390dpi Live Fingerprint Imager Based on Feedback Capacitive Sensing Scheme", 1997, IEEE International Solid-state Circuits Conference.

* cited by examiner

*Primary Examiner* — Daniel Luke
*Assistant Examiner* — Khatib Rahman
(74) *Attorney, Agent, or Firm* — WPAT, PC (57) ABSTRACT

A semiconductor sensor device is disclosed. The semiconductor sensor device includes a plurality of pixels and a phase grating structure. The phase grating structure has periodically arranged patterns and is disposed on the pixels.

16 Claims, 7 Drawing Sheets

SEMICONDUCTOR SENSOR DEVICE

BACKGROUND

Technical Field

The disclosure relates in general to a semiconductor sensor device, and more particularly to a semiconductor sensor device with adjustable color appearance.

Description of the Related Art

Fingerprint sensors have become more and more popular in user authentication, since biometric information is more reliable than conventional methods of using IDs and passwords, and thus have been applied in various portable electronic devices, such as mobile phones, tablet computers, and etc. On the other hand, requirements for appearance designs of portable electronic devices have increased as well.

Therefore, there is a need for a fingerprint sensor that is suitable for installation in portable electronic devices while keeping the appearance design of portable electronic devices attractive to customers.

SUMMARY OF THE INVENTION

The disclosure is directed to a semiconductor sensor device. In the embodiments, in the semiconductor sensor device, a phase grating structure having periodically arranged patterns is disposed on the pixels; accordingly, the color appearance of the semiconductor sensor device can be adjusted by varying the design of the periodically arranged patterns of the phase grating structure.

According to an embodiment of the present disclosure, a semiconductor sensor device is disclosed. The semiconductor sensor device includes a plurality of pixels and a phase grating structure. The phase grating structure has periodically arranged patterns and is disposed on the pixels.

The disclosure will become apparent from the following detailed description of the preferred but non-limiting embodiments. The following description is made with reference to the accompanying drawings.

DETAILED DESCRIPTION OF THE INVENTION

In the embodiments, in the semiconductor sensor device, a phase grating structure having periodically arranged patterns is disposed on the pixels; accordingly, the color appearance of the semiconductor sensor device can be adjusted by varying the design of the periodically arranged patterns of the phase grating structure. The embodiments are described in details with reference to the accompanying drawings. The procedures and details of the method of the embodiments are for exemplification only, not for limiting the scope of protection of the disclosure. Moreover, the identical elements of the embodiments are designated with the same reference numerals. Also, it is also important to point out that the illustrations may not be necessarily be drawn to scale, and that there may be other embodiments of the present disclosure which are not specifically illustrated. Thus, the specification and the drawings are to be regard as an illustrative sense rather than a restrictive sense.

Figure 1:
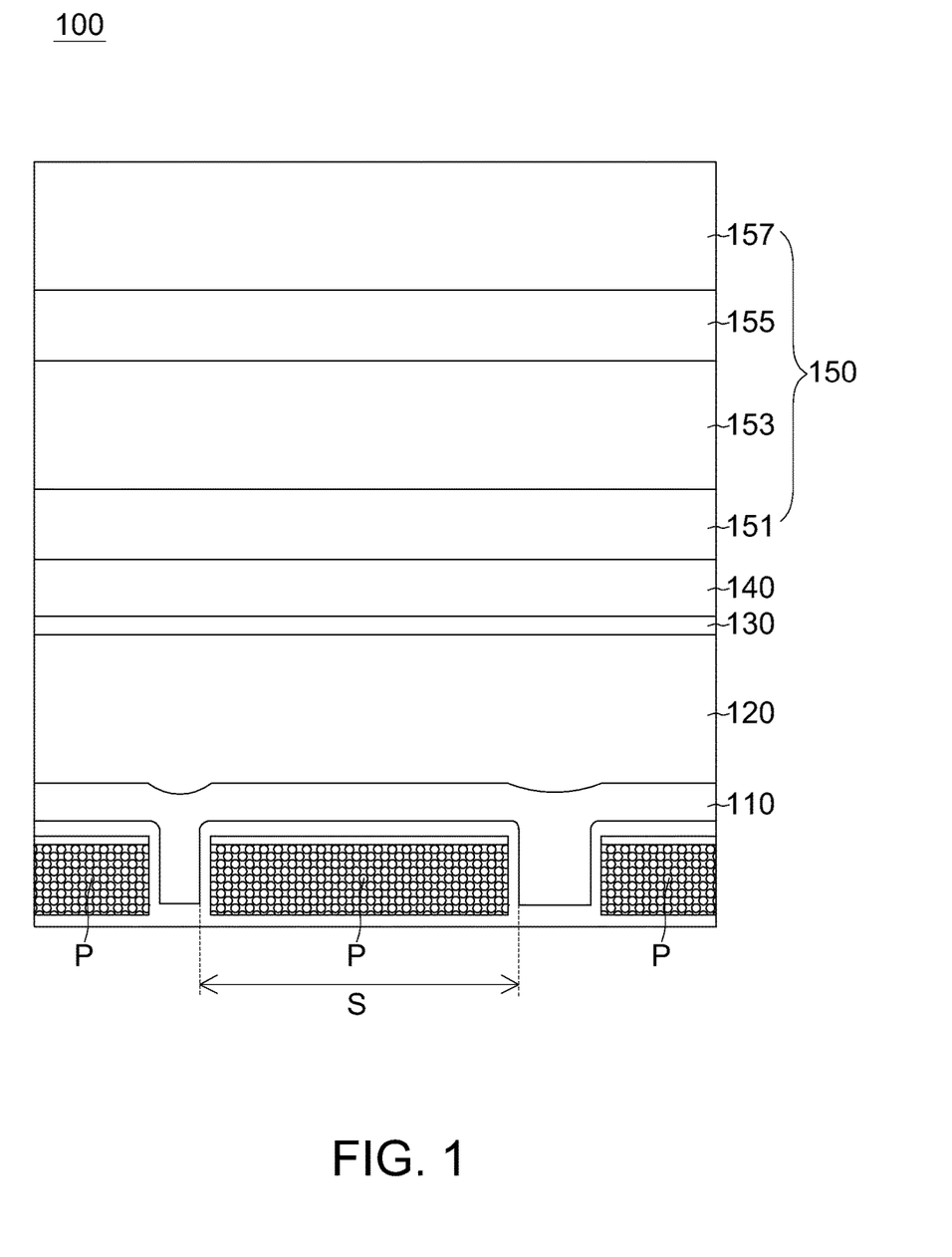
FIG. 1 shows a schematic drawing of a semiconductor sensor device according to an embodiment of the present disclosure.

Referring to FIG. 1, a schematic drawing of a semiconductor sensor device 100 according to an embodiment of the present disclosure is shown. The semiconductor sensor device 100 includes a plurality of pixels P and a phase grating structure. The phase grating structure has periodically arranged patterns and is disposed on the pixels P.

In some embodiments, the semiconductor sensor device 100 may be a fingerprint sensor or a CMOS image sensor, both including pixel arrays and having adjustable color appearance. For example, the semiconductor sensor device 100 may be a capacitance silicon type fingerprint sensor or a RF field type fingerprint sensor.

The periodically arranged patterns of the phase grating structure give an effect that the semiconductor sensor device 100 shows certain color appearance. Particularly, the periodically arranged patterns repeat themselves and show periodicity, and such repeatability and periodicity of the patterns provide that the semiconductor sensor device 100 covered with the periodically arranged patterns shows uniform color appearance. According to some embodiments of the present disclosure, the color appearance of the semiconductor sensor device 100 is adjustable by varying the design of the periodically arranged patterns of the phase grating structure. The descriptions and embodiments of the periodically arranged patterns will be described in details with reference to the accompanying drawings in the following paragraphs.

As shown in FIG. 1, the semiconductor sensor device 100 may further include a planarization layer 110 formed on the pixels P. In the embodiment, the planarization layer 110 is such as a SOG (spin-on glass) layer.

The semiconductor sensor device 100 may further include a passivation layer 120, a recap oxide layer 130, and a nitride layer 140. In the embodiment, the passivation layer 120 is formed on the planarization layer 110, the recap oxide layer 130 is formed on the passivation layer 120, and the nitride layer 140 is formed on the recap oxide layer 130. The passivation layer 120 is formed of oxide, such as silicon oxide, and the nitride layer 140 is formed of such as silicon nitride. While micro-scratches may be formed on the top surface of the passivation layer 120 after a CMP process is performed thereon, the recap oxide layer 130 formed on the micro-scratches can provide an improve planarization. In the embodiment, the passivation layer 120 has a height of about 13 K Å, and the nitride layer 140 has a height of about 7 K Å.

In an embodiment, the periodically arranged patterns may be formed in at least one of the passivation layer 120, the recap oxide layer 130, or the nitride layer 140. That is, the periodically arranged patterns may be fabricated within the structure of the passivation layer 120, the recap oxide layer 130, and/or the nitride layer 140. In the manufacturing process, the periodically arranged patterns may be fabricated together with or after the formation of the passivation layer 120, the recap oxide layer 130, and/or the nitride layer 140.

As shown in FIG. 1, the semiconductor sensor device 100 may further include a protection layer 150. The protection layer 150 is formed on the pixels P. In the embodiment, the protection layer 150 is formed on the nitride layer 140 for providing further protection to the semiconductor sensor device 100. In the embodiment, the protection layer 150 may comprise stacked layers of at least an oxide layer and at least a nitride layer. In the present embodiment, as shown in FIG. 1, the protection layer 150 comprises stacked layers of two oxide layers 151, 155 and two nitride layers 153, 157. The oxide layers 151, 155 are formed of such as silicon oxide, and the nitride layers 153, 157 are formed of such as silicon nitride. In the embodiment, the oxide layer (151/155) of the protection layer 150 has a height of about 10 K Å, and the nitride layer (153/157) of the protection layer 150 has a height of about 50 K Å. However, the selections of the heights and numbers of oxide layers and nitride layers may vary depending on the conditions applied and are not limited thereto.

In an embodiment, the periodically arranged patterns may be formed in the protection layer 150. That is, according to the embodiments of the present disclosure, the periodically arranged patterns may be formed in at least one of the above-mentioned oxide layers 151, 155 and the nitride layers 153, 157.

In some embodiments, the periodically arranged patterns of the phase grating structure are aligned with each other and uniform in size and shape. The periodically arranged patterns may be polygonal shaped, circular shaped, elliptical shaped, strip shaped, hollow shaped, grid-shaped, or serrated strip shaped. However, the selections of the shape(s) of the periodically arranged patterns may vary depending on the conditions applied and are not limited thereto.

In some embodiments, the periodically arranged patterns may further comprise at least two different sets of periodic patterns. That is, the at least two sets of the periodic patterns may have different sizes and/or shapes, however, each of the sets of the periodic patterns comprises patterns repeated themselves periodically and having uniform size and shape. The at least two sets of the periodic patterns may be combined and form the phase grating structure in a variety of fashions, and different combinations may result in different color appearances. In other words, the color appearance of the semiconductor sensor device 100 is adjustable according to how these sets of the periodic patterns are structurally combined. Besides, the at least two sets of the periodic patterns have different refractive indexes due to the structural differences. In practical, the fashions of the combinations may vary depending on the conditions applied, as long as the resulted phase grating structure is provided with certain uniform color appearance of the semiconductor sensor device 100.

In an embodiment, the pixels P may have a size S of about 60 μm×60 μm, and the periodically arranged patterns may have dimensions of 1-2.5 μm. Accordingly, compared with the size of the pixels P, the size of the periodically arranged patterns is so small that the sensor functions of the semiconductor sensor device 100, such as a fingerprint sensor or a CMOS image sensor, would not be influenced by the phase grating structure.

In an embodiment, the periodically arranged patterns have a height, and the ratio of the height to the dimension, e.g. width, length, or diameter, of the periodically arranged patterns, is about 1:1. For example, while the periodically arranged patterns have dimensions of 1-2.5 μm, the height of the periodically arranged patterns may be 1-2.5 μm. However, the heights and the dimensions of the periodically arranged patterns may vary according to the conditions applied and are not limited thereto. In some embodiments, the phase grating structure may have an adjustable height for adjusting the color appearance of the semiconductor sensor device 100.

A number of embodiments are disclosed below to provide detailed descriptions of the phase grating structure of the disclosure. Referring to FIGS. 2-8, top views of the phase grating structure according to some embodiments of the present disclosure are shown.

Figure 2:
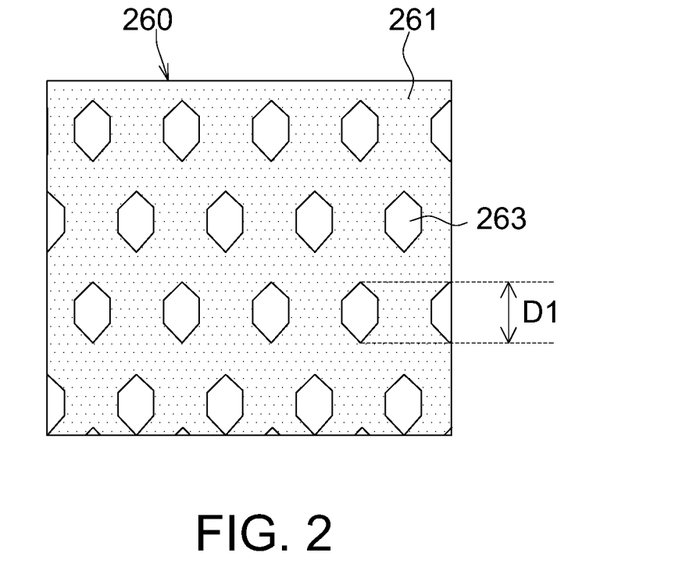
FIGS. 2-8 show top views of the phase grating structure according to some embodiments of the present disclosure.

As shown in FIG. 2, the phase grating structure 260 has a first region 261 formed of protrusions and a second region 263 formed of indentations. In some embodiments, the periodically arranged patterns may refer to the protrusions of the first region 261 or the indentations of the second region 263. As shown in FIG. 2, in the present embodiment, the indentations of the second region 263 are taken as an example of the periodically arranged patterns, the indentations are polygonal shaped, the polygonal indentations are aligned with each other and uniform in size and shape, and the dimension D1 of the indentations is about 1-2.5 μm.

Furthermore, since the indentations are filled with an overlying layer formed of a material different from that of the phase grating structure 260, the first region 261 has a refractive index different from that of the second region 263. For example, referring to FIG. 1, while the phase grating structure 260 is fabricated within the oxide layer 151, that is, the protrusions are formed from the oxide layer 151; accordingly, the indentations of the phase grating structure 260 are filled with the overlying nitride layer 153. As such, the first region 261 is formed from the oxide layer 151, and the second region 263 is formed from the nitride layer 153; thereby, the protrusions of the first region 261 have a refractive index different from that of the indentations of the second region 263.

In an alternative embodiment, the structural arrangement of the protrusions of the first region 261 and the indentations of the second region 263, as shown in FIG. 2, may be reversed (not shown). As such, in the present embodiment, the protrusions of the first region are referred as the periodically arranged patterns, and the protrusions are polygonal shaped and aligned with each other and uniform in size and shape.

Figure 3:
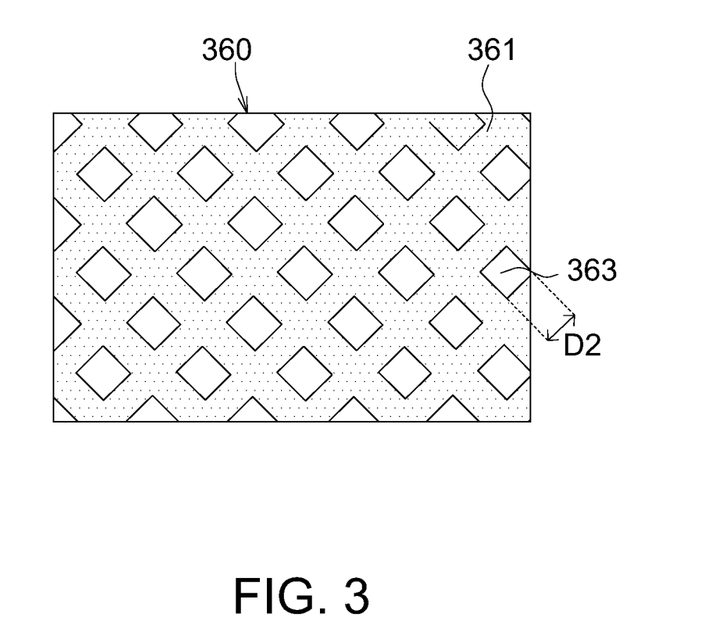

As shown in FIG. 3, the phase grating structure 360 has a first region 361 formed of protrusions and a second region 363 formed of indentations. The phase grating structure 360 of the present embodiment is different from the phase grating structure 260 of the previous embodiment in that the periodically arranged patterns of the phase grating structure 360 are rectangular shaped, and the periodically arranged patterns of the phase grating structure 260 are hexagonal shaped. In the present embodiment, the dimension D2 of the periodically arranged patterns is such as the width of the rectangular indentations. The similarities are not repeated here.

Figure 4:
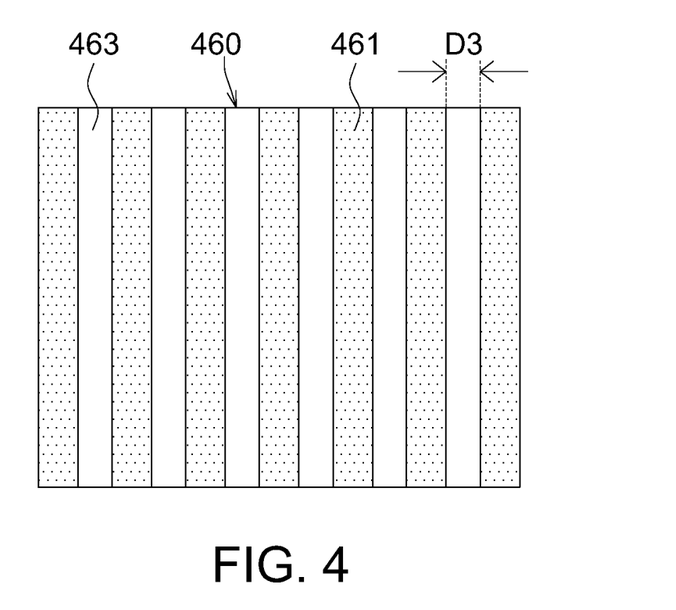

As shown in FIG. 4, the phase grating structure 460 has a first region 461 formed of protrusions and a second region 463 formed of indentations. The difference between the present embodiment and the previous embodiments is that the periodically arranged patterns of the phase grating structure 460 are strip shaped, and the dimension D3 of the periodically arranged patterns is such as the width of the strip indentations. The similarities are not repeated here.

Figure 5:
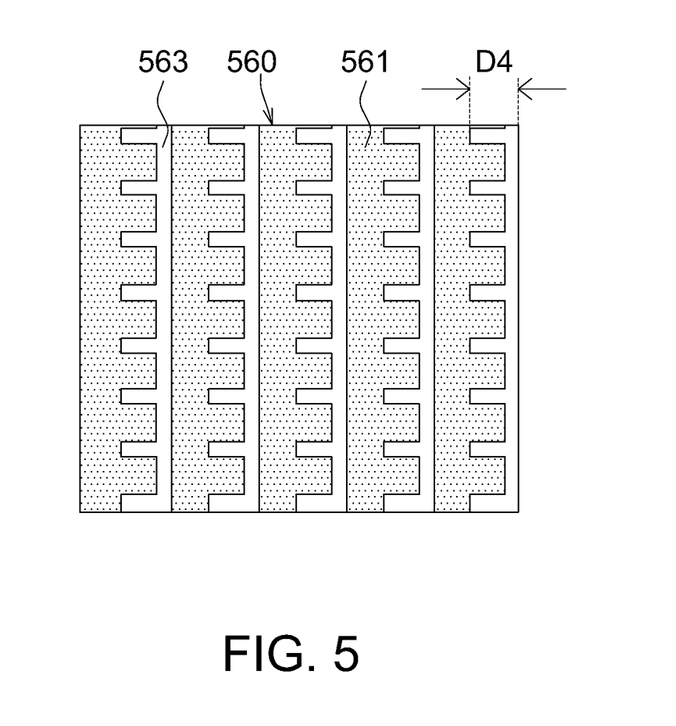

As shown in FIG. 5, the phase grating structure 560 has a first region 561 formed of protrusions and a second region 563 formed of indentations. The difference between the present embodiment and the previous embodiments is that the periodically arranged patterns of the phase grating structure 560 are serrated strip shaped, and the dimension D4 of the periodically arranged patterns refers to such as the length of the serrations of the indentations. The similarities are not repeated here.

Figure 6:
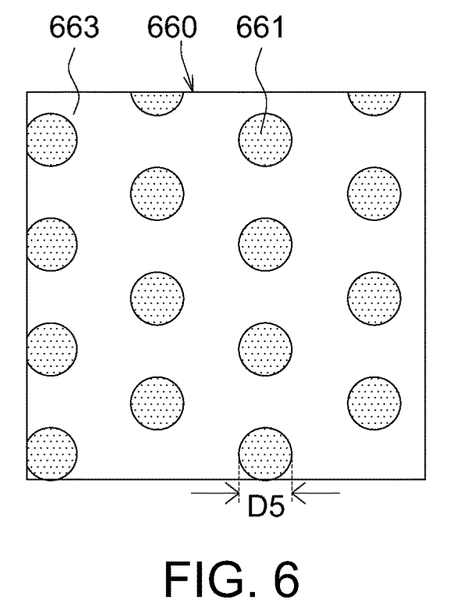

As shown in FIG. 6, the phase grating structure 660 has a first region 661 formed of protrusions and a second region 663 formed of indentations. The difference between the present embodiment and the previous embodiments is that the periodically arranged patterns of the phase grating structure 660 are the protrusions of the first region 661, the protrusions being circular shaped, and the dimension D5 of the periodically arranged patterns is such as the diameter of the circular protrusions. The similarities are not repeated here.

Figure 7:
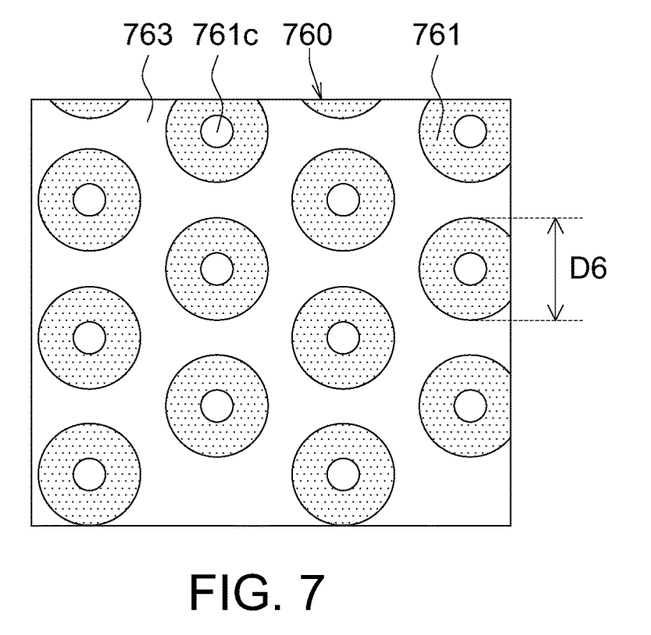

As shown in FIG. 7, the phase grating structure 760 has a first region 761 formed of protrusions and a second region 763 formed of indentations. The difference between the present embodiment and the previous embodiments is that the periodically arranged patterns of the phase grating structure 760 are the protrusions of the first region 761, the protrusions being hollow shaped, and the dimension D6 of the periodically arranged patterns is such as the diameter of the hollow shaped protrusions. The depth of the cavities 761c located in the centers of the hollow protrusions of the first region 761 may be the same with or different from the depth of the indentations of the second region 763. The similarities between the present embodiment and the previous ones are not repeated here.

Figure 8:
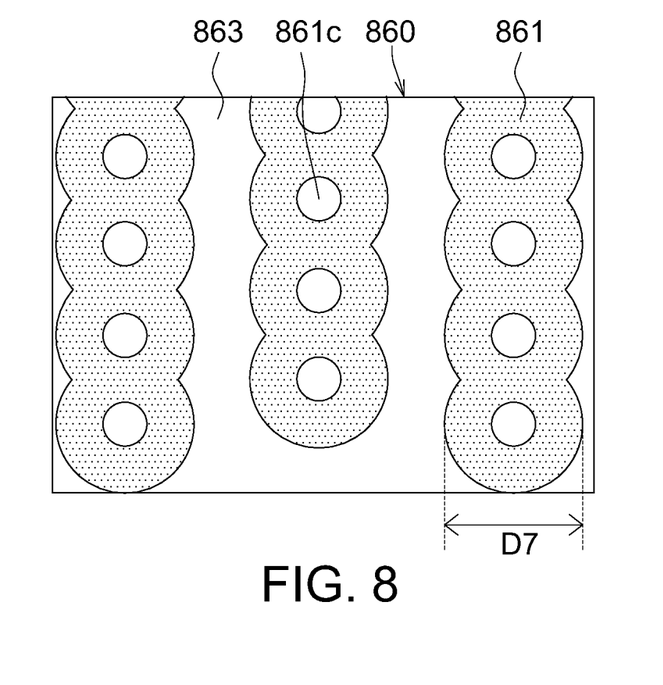

As shown in FIG. 8, the phase grating structure 860 has a first region 861 formed of protrusions and a second region 863 formed of indentations. The difference between the present embodiment and the previous embodiments is that the periodically arranged patterns of the phase grating structure 860 are hollow shaped protrusions, each having a plurality of cavities 861c, and the dimension D7 of the periodically arranged patterns is such as the width of the hollow shaped protrusions. The depth of the cavities 861c of the hollow protrusions of the first region 861 may be the same with or different from the depth of the indentations of the second region 863. The similarities between the present embodiment and the previous ones are not repeated here.

Figure 9:
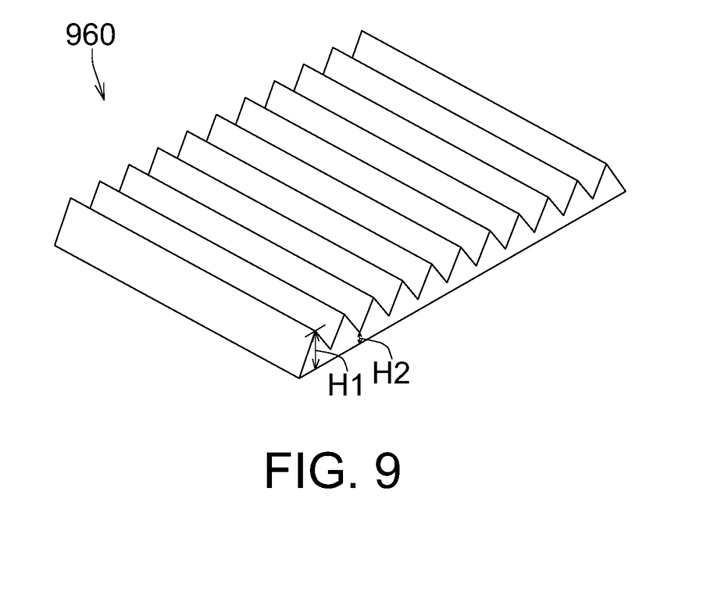
FIGS. 9-10 show stereoscopic diagrams of the phase grating structure according to some embodiments of the present disclosure.
Figure 10:
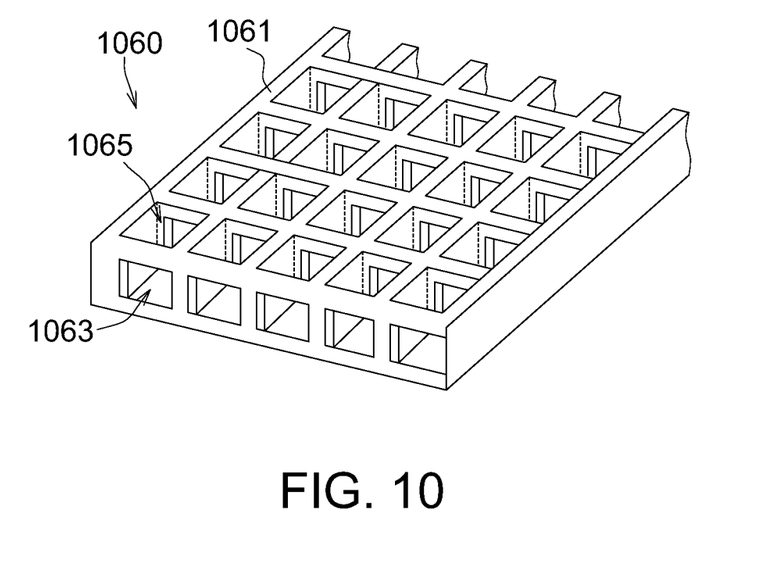

FIGS. 9-10 show stereoscopic diagrams of the phase grating structure according to some embodiments of the present disclosure. In some embodiments, the periodically arranged patterns of the phase grating structure may have non-uniform heights. For example, as shown in FIG. 9, the periodically arranged patterns may be prisms, which are aligned with each other and uniform in size and shape, and the height H1 is different from the height H2. However, prisms are merely taken as an example showing non-uniform heights, and the structures of the periodically arranged patterns may vary depending on the conditions applied and are not limited thereto.

In some embodiments, the phase grating structure may be a layer having cavities or channels, the cavities or the channels being the periodically arranged patterns. For example, as shown in FIG. 10, the phase grating structure 1060 is a layer 1061 having channels 1063 within the layer 1061 and grid-like openings 1065 on the top surface of the layer 1061. The channels 1063 are periodically arranged aligned with each other and uniform in size and shape. The openings 1065 are periodically arranged aligned with each other and uniform in size and shape. In other embodiments, the phase grating structure being a layer having periodically arranged cavities or channels may have non-uniform heights as well.

The structure as shown in FIG. 10 is merely an example of the phase grating structure, having periodically arranged cavities or channels, of the present disclosure. In fact, there may be provided with a number of variations of the phase grating structure, as long as the cavities or channels within the three-dimensional phase grating structure are periodically arranged. For example, biomimetic architectures with periodically arranged patterns may be implanted as a variation of the phase grating structure of the present disclosure, such as wing structures of butterflies, of which the complex structure may include periodically arranged columnar windows created by a network of ridges and spaced cross-ribs.

Figure 11A:
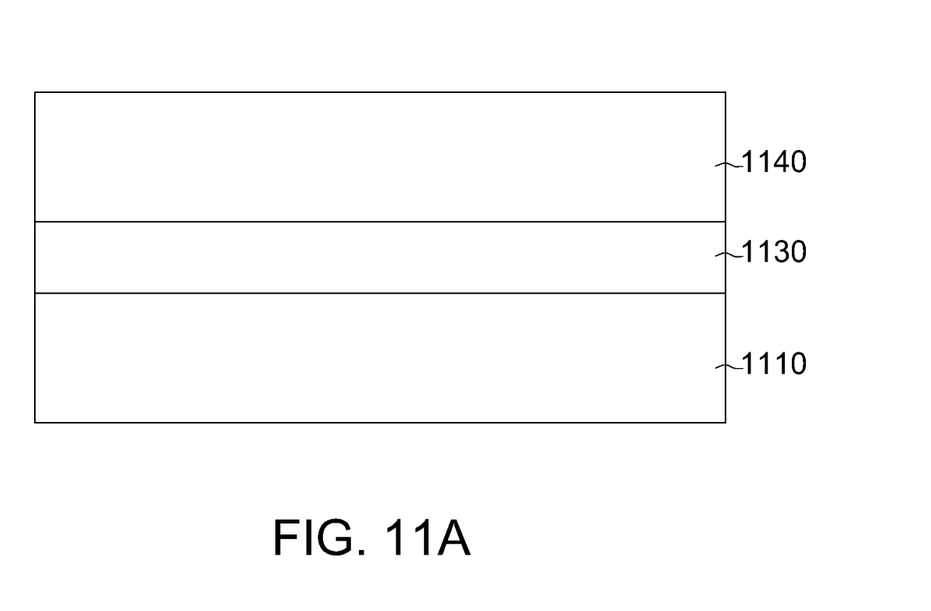
FIGS. 11A-11B illustrate a manufacturing method of a semiconductor sensor device according to an embodiment of the present disclosure.
Figure 11B:
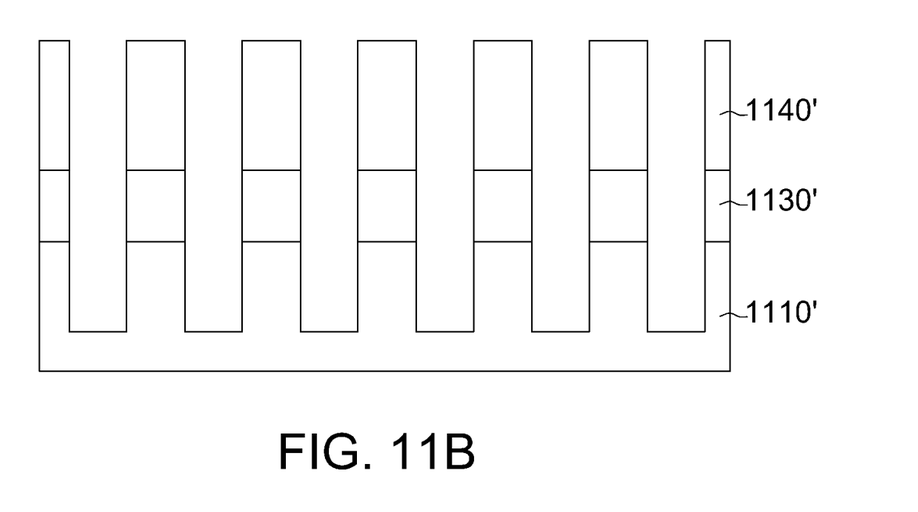

FIGS. 11A-11B illustrate a manufacturing method of a semiconductor sensor device according to an embodiment of the present disclosure. As shown in FIG. 11A, a substrate 1110 is provided, an oxide layer 1130 is formed on the substrate 1110, and a nitride layer 1140 is formed on the oxide layer 1130. The substrate 1110 may include pixels, a planarization layer, and a passivation layer (not shown), optionally.

As shown in FIG. 11B, a phase grating structure is fabricated in the substrate 1110', the oxide layer 1130', and the nitride layer 1140'. It is noted that the drawing of the phase grating structure as shown in FIG. 11B is regarded as an illustrative sense. Table 1 shows the results of the color appearances of the semiconductor sensor device as shown in FIG. 11B in which the phase grating structures 260-860, as shown in FIGS. 2-8, are fabricated.

TABLE 1

| Phase grating structure | Color appearance |
| --- | --- |
| Structure 260 as shown in FIG. 2 | Dark red |
| Structure 360 as shown in FIG. 3 | Bluish dark red |
| Structure 460 as shown in FIG. 4 | Blue |
| Structure 560 as shown in FIG. 5 | Grey |
| Structure 660 as shown in FIG. 6 | Greenish orange |
| Structure 760 as shown in FIG. 7 | Orange |
| Structure 860 as shown in FIG. 8 | Green |

As shown in Table 1, the color appearance of the semiconductor sensor device can be changed by varying the design of the periodically arranged patterns of the phase grating structure. Furthermore, according to the results shown in Table 1, similar designs are provided with similar color appearances. For example, the structural arrangements of the periodically arranged patterns of the phase grating structures 260 and 360 are similar, between which the main difference is in the shapes of the patterns; accordingly, the color appearances of the phase grating structures 260 and 360 are dark red and bluish dark red, respectively, which are similar. Therefore, according to the embodiments of the present disclosure, it is evident that the color appearance of the semiconductor sensor device can be adjusted by systematically varying the design of the periodically arranged patterns of the phase grating structure.

In addition, according to the embodiments of the present disclosure, the phase grating structure for adjusting the color appearance of the semiconductor sensor device can be manufactured in one step with high precision, without having to perform multiple manufacturing steps, such as multiple deposition processes, to form multiple films for showing a certain color appearance. As such, the manufacturing process of the semiconductor sensor device is simplified, and the precision of the whole manufacturing process is improved.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broad-

What is claimed is:

1. A semiconductor sensor device, being a capacitance silicon type fingerprint sensor or a RF field type fingerprint sensor, and comprising:
   a plurality of pixels, wherein the plurality of the pixels are signal resolutions of the capacitance silicon type fingerprint sensor or the RF field type fingerprint sensor;
   a protection layer formed on the pixels; and
   a phase grating structure having periodically arranged patterns disposed on the pixels, wherein the periodically arranged patterns are formed in the protection layer.

2. The semiconductor sensor device according to claim 1, wherein the periodically arranged patterns have dimensions of 1-2.5 µm.

3. The semiconductor sensor device according to claim 1, wherein the phase grating structure has a first region formed of protrusions and a second region formed of indentations, and the periodically arranged patterns are the protrusions or the indentations.

4. The semiconductor sensor device according to claim 3, wherein the first region has a refractive index different from that of the second region.

5. The semiconductor sensor device according to claim 1, wherein the periodically arranged patterns have non-uniform heights.

6. The semiconductor sensor device according to claim 1, wherein the periodically arranged patterns further comprise at least two sets of periodic patterns different from each other.

7. The semiconductor sensor device according to claim 1, wherein the periodically arranged patterns have a height, and the ratio of the height to a dimension of the periodically arranged patterns is about 1:1.

8. The semiconductor sensor device according to claim 1, wherein the periodically arranged patterns are polygonal shaped, circular shaped, elliptical shaped, strip shaped, hollow shaped, grid-shaped, or serrated strip shaped.

9. The semiconductor sensor device according to claim 1, wherein the periodically arranged patterns of the phase grating structure are aligned with each other and uniform in size and shape.

10. The semiconductor sensor device according to claim 1, further comprising:
    a planarization layer formed on the pixels.

11. The semiconductor sensor device according to claim 10, further comprising:
    a passivation layer formed on the planarization layer;
    a recap oxide layer formed on the passivation layer; and
    a nitride layer formed on the recap oxide layer.

12. The semiconductor sensor device according to claim 11, wherein the periodically arranged patterns are formed in at least one of the passivation layer, the recap oxide layer, or the nitride layer.

13. The semiconductor sensor device according to claim 1, wherein the protection layer comprises stacked layers of at least an oxide layer and at least a nitride layer.

14. The semiconductor sensor device according to claim 1, wherein the pixels have a size of about 60 µm×60 µm.

15. The semiconductor sensor device according to claim 1, wherein the phase grating structure is a layer having cavities or channels, the cavities or the channels being the periodically arranged patterns.

16. The semiconductor sensor device according to claim 1, wherein the phase grating structure has an adjustable height for adjusting the color appearance of the semiconductor sensor device.

* * * * *